INVENTOR.
JULIAN R. A. BEALE
ANDREW F. BEER
BY
Frank R. Trifari
AGENT

April 9, 1968 J. R. A. BEALE ETAL 3,377,527

LOW CAPACITY AND RESISTANCE TRANSISTOR STRUCTURE EMPLOYING A TWO-CONDUCTIVITY COLLECTOR REGION

Filed Dec. 15, 1964 2 Sheets-Sheet 2

INVENTOR.
JULIAN R. A. BEALE
ANDREW F. BEER
BY
Frank R. Trifari
AGENT 3,377,527

LOW CAPACITY AND RESISTANCE TRANSISTOR STRUCTURE EMPLOYING A TWO-CONDUCTIVITY COLLECTOR REGION

Julian Robert Anthony Beale, Reigate, and Andrew Francis Beer, Crawley, England, assignors to North American Philips Company, Inc., New York, N.Y., a corporation of Delaware Filed Dec. 15, 1964, Ser. No. 418,446
11 Claims. (Cl. 317—235)

ABSTRACT OF THE DISCLOSURE

A transistor in which the collector zone is divided into two regions of different conductivity each of which is contiguous with the base zone. The collector zone having the higher conductivity is located at least in part directly opposite the emitter zone. This construction provides a transistor exhibiting reduced collector series resistance without a corresponding excessive increase in collector capacitance. The construction is especially useful with planar transistor types.

The invention relates to a transistor comprising a semiconductor body having an emitter zone, a base zone and a collector zone, in which the extent of the emitter zone is small as compared with that of the base zone and of the collector zone.

Transistors of this type are for example planar transistors, in which the base zone and the emitter zone are provided in the body by diffusion through openings in a masking oxide layer from one side of the semiconductor body.

In this transistor a desired, low collector series resistance may be obtained by rendering the whole collector zone low-ohmic. However, this involves usually an excessively high collector capacity. In order to obtain a low collector capacity, the collector zone must be rendered more high-ohmic, which has an adverse effect on the said series resistance.

The invention has for its object inter alia to provide an advantageous solution for said problems.

In accordance with the invention a transistor comprising a semiconductor body having an emitter zone, a base zone and a collector zone, in which the extent of the emitter zone is small as compared with that of the base zone and of the collector zone, is characterized in that the collector zone has a more highly doped part and a less highly doped part, which both engage the base zone, while only part of the volume of the collector zone directly adjacent the base zone is more highly doped, said more highly doped part, when viewed from the emitter zone in the direction of thickness of the base zone, being located at least partly underneath the emitter zone.

The various zones and parts referred to above are located at least partly one below the other and are, at least partly, not visually perceptible, so that "viewed" is to be understood figuratively and not in the optical sense.

The extent of the zone is to denote transversely of the direction of thickness of the zone.

The more highly doped part of the collector zone is considered to be directly adjacent the base zone, if this part is reached by the depletion layer which is produced at the base-collector junction, when this junction is biased in the reverse direction by a voltage having a value between 5 and 10 v. It should be noted that sharp junctions are not obtained, if for example diffusion treatments are employed for the formation of zones in a semiconductor body.

It will be obvious that a transistor according to the invention as compared with a transistor in which the whole part of the collector zone directly adjacent the base zone is less highly doped, exhibits a reduction of the series resistance, whereas the capacity is only slightly higher. On the other hand, as compared with a transistor in which the whole part of the collector zone directly adjacent the base zone is more highly doped, the transistor according to the invention exhibits a reduction in collector capacity, whereas the series resistance is only slightly higher. A particularly favourable compromise is obtained, if the said more highly doped part viewed from the emitter zone in the direction of thickness of the base zone, is located below the whole emitter zone.

The lateral surface of the base zone may be at least twice that of the emitter zone. The extent of the said more highly doped part is preferably not more than twice that of the emitter zone.

The more highly doped part of the collector zone may extend advantageously beyond the lateral boundaries of the base zone in one or more lateral directions. Thus the collector series resistance is reduced owing to the resultant lateral spread of the current in the collector zone. The part of the more highly doped part extending beyond the lateral boundaries of the base zone does substantially not contribute to the collector capacity.

In an important embodiment the emitter zone has the form of a strip which extends across the base zone in its longitudinal direction. In this case the more highly doped part of the collector zone extends preferably beyond the lateral boundaries of the base zone in the longitudinal direction of the strip. Two base contacts may be provided, one on each side of the strip-shaped emitter zone and substantially symmetrically thereto.

In a further important embodiment the emitter zone is substantially annular. In this case the emitter zone may be surrounded substantially completely by a base contact. The more highly doped part of the collector zone then extends preferably beyond the lateral boundaries of the base zone in a direction which corresponds to a gap in the surrounding base contact.

A further reduction of the collector series resistance may be obtained in a construction in which the semiconductor body has a substantially flat surface, on which the emitter zone is provided, while the part of the more highly doped part extending beyond the lateral boundaries of the base zone reaches said surface and is covered at least partly with a metal layer. The emitter-, base- and collector connections may then be simply provided on one side of the semiconductor body.

A transistor according to the invention is preferably a planar transistor, in which the more highly doped part, the base zone and the emitter zone are obtained by diffusion of impurities in the semiconductor body through openings in a masking oxide layer provided on the semiconductor body.

Embodiments of transistors and methods of manufacturing the same according to the invention will now be described with reference to the accompanying diagrammatic drawing.

The shading of the cross sections is omitted from FIGS. 2, 3, 5 and 6 for the sake of clarity.

Figure 1:
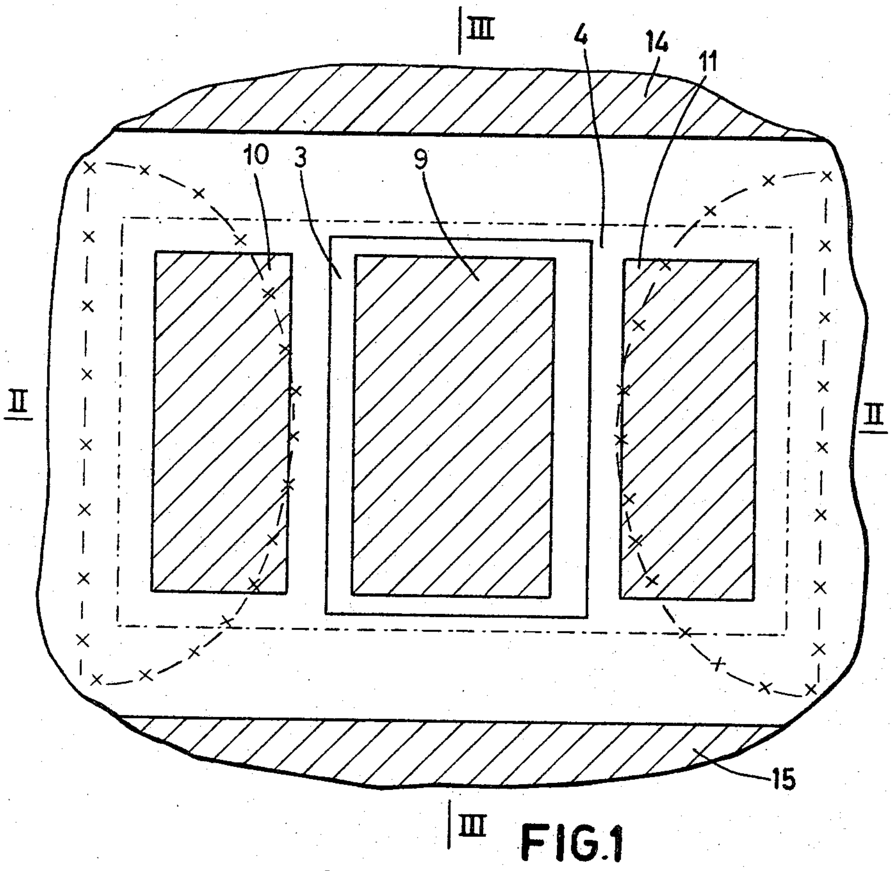
FIG. 1 is a plan view of a first embodiment of a transistor according to the invention.
Figure 2:
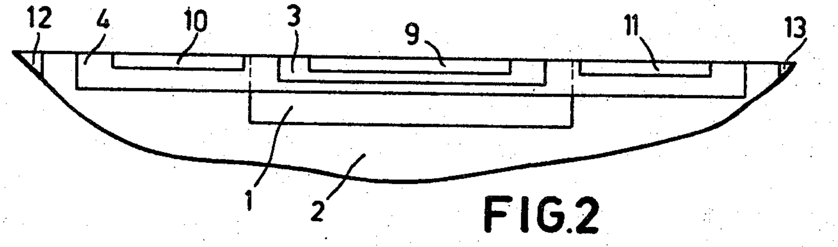
FIGS. 2 and 3 are cross sectional views taken on the line II—II and III—III respectively in FIG. 1.
Figure 3:
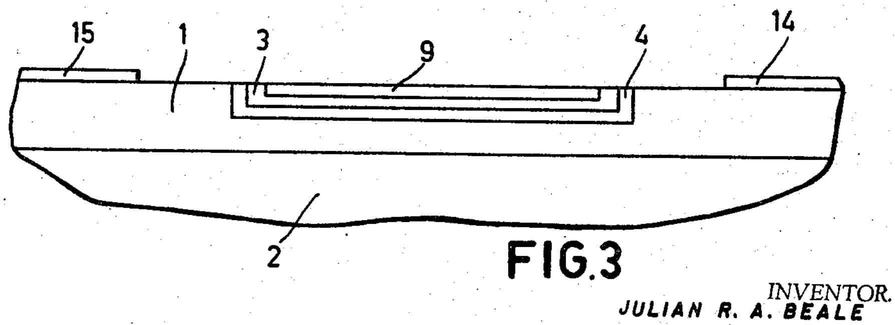

The transistor as shown in FIGS. 1, 2 and 3 comprises a silicon die, a more highly doped n-type part 1 and a less highly doped n-type part 2 (shown only partly), which parts constitute together a collector zone 1, 2. The thickness of the plate is 200$\mu$ and the part 2 has a resistivity of 5 ohm-cm.

An n-type emitter zone 3 and a p-type base zone 4 are also provided. Only part of the volume of the collector zone directly adjacent the base zone 4 is more highly doped and this part, viewed from the emitter zone 3 in the direction of thickness of the base zone 4, is located below the whole emitter zone 3. The extent of the base zone 4 is more than three times that of the emitter zone 3, and the extent of the more highly doped part is not more than twice that of the emitter zone. The more highly doped part 1 and the less highly doped part 2 are both adjacent the base zone 4.

The emitter zone 3 has the form of a strip, which extends substantially transversely across the base zone 4. An emitter contact 9 and two base contacts 10 and 11 are provided, the latter contacts having the form of strips which are substantially parallel to the emitter contact 9 while the emitter zone 3 is located between the contacts 10 and 11.

FIG. 1 is a plan view in which the zones and further parts of the transistor are shown viewed from the emitter zone 3 in the direction of thickness of the base zone 4, without considering optical perceptibility on the surface of the semiconductor body. The contacts 9, 10 and 11 are shaded and surrounded by full lines. The emitter zone 3 is surrounded by a full line and the base zone 4 by a dot-and-dash line. The regions surrounded by the chain-cross lines are those in which the less highly doped part 2 of the collector is directly adjacent the base zone 4. The more highly doped part 1 extends beyond the base zone 4 in the direction of length of the strip 3 and at a given distance from the base zone 4 around said base zone; this is shown in FIG. 2 by the parts 12 and 13 of the collector zone.

It will be apparent that the lateral boundaries of the more highly doped part 1 on each side (as is shown in FIG. 1) of the emitter zone 3 are indicated by curved lines, the part 1 being narrower at the level of the centre of the strip-shaped emitter zone 3 in the longitudinal direction of the latter. The shape of the part 1 thus obtained permits of reducing the collector series resistance, while the collector-base capacity is raised only slightly. Metal layers 14 and 15 are provided on the more highly doped part 1 of the collector zone in order to improve the conduction of current in the collector zone.

FIG. 3 is a cross sectional view taken on the line III—III in FIG. 1.

Conductors (not shown) are secured to the contacts 9, 10 and 11. A conductor connected to the collector zone may be provided on the bottom surface of the semiconductor body (not shown in FIGS. 1 to 3) and/or on the metal layer 14, 15. Parts of the surface of the die are provided with an oxide layer (not shown).

A method of manufacturing a transistor as described in FIGS. 1, 2 and 3 will now be described more fully.

The manufacture starts from an n-type silicon die doped with phosphorus and having a resistivity of 5 ohm-cm. and a thickness of 0.25 mm. The transverse dimensions are unessential, since the transistor to be manufactured may be one of a large number of transistors on a single silicon die, which is subdivided subsequently in order to obtain the separate transistors. As an alternative the transistor may form part of a solid circuit in which further circuit elements are provided in the semiconductor.

An oxide layer is grown on the die by heating in wet oxygen saturated with water vapour of 98° C. for 4 hours at 860° C. The oxide layer is removed from the surface at the place where the more highly doped part 1 of the collector is to be provided. The parts inside the chain-cross lines of FIG. 1 remain protected by the oxide layer against the diffusion effect and the remaining part of the surface of the die is subjected to the diffusion treatment. The oxide layer is locally removed in a conventional manner by means of a photoresist and an etchant.

Phosphorus is diffused into the free surface of the die by heating the die at 1150° C. for 80 minutes in an oven in which phosphorus nitride is heated at 900° C. The resultant vapour is led over the die by means of a flow of nitrogen. The resultant diffused n-type zone 1 is indicated in FIG. 2 partly by a broken line. The thickness of the zone 1 is 3$\mu$ and the surface concentration of phosphorus is about $2\times10^{18}$ atoms/ccm.

The oxide layer is regrown by heating it again at 860° in wet oxygen for 4 hours, after which an opening is made in the oxide layer for obtaining the base zone 4. Then boron is diffused into the die through the opening by heating the die at 1100° C. for 20 minutes in an oven in which boron nitride is heated at 1000° C., the resultant vapour being led over the die by means of flow of nitrogen. The thickness of the p-type zone 4 thus obtained is 1$\mu$ and the surface concentration of boron is about $1\times10^{19}$ atoms/ccm.

The oxide is regrown in the manner described above and an opening is provided in the oxide layer for obtaining the emitter zone 3. Phosphorus is diffused into the die for obtaining the emitter zone 3 by heating the die at 1100° C. for 10 minutes in an oven in which phosphorus nitride is heated at 1000° C. and the resultant vapour is led over the die by means of a flow of nitrogen. The thickness of the resultant n-type zone 3 is 0.5$\mu$ and the surface concentration of phosphorus is about $5\times10^{20}$ atoms/ccm.

The oxide is regrown in the manner described above and the openings are provided in said oxide layer for the contacts 9, 10 and 11 and the metal layer 14, 15. An aluminum layer of a thickness of 3000 A. is applied to the whole surface of the oxide layer and the openings by vapour deposition in vacuo. The aluminum layer is removed with the exception of the parts shaded in FIGS. 9, 10, 11, 14, 15, in a conventional manner by means of a photoresist and an etchant. The aluminum is then alloyed onto the die by heating the latter at a temperature from 550° C. to 600° C. for 20 minutes in an atmosphere of pure hydrogen.

Conductors formed by gold wires may be connected with the contacts 9, 10, 11 and the layer 14, 15 by pressing the gold wires against the contacts for 20 seconds at a temperature of 350° C.

The lower side of the die may be ground off, so that the die attains a final thickness of 200$\mu$. The ground surface of the die may be secured to a gold-plated Ni-Fe support by heating at 450° C. The support may, if desired, be used as a collector connection.

After each diffusion and alloying operation as described above the surface of the die and of the oxide layer are cleaned by boiling the die in concentrated nitric acid for 15 minutes and by washing the die in distilled, deionized water. It should be noted that the surface of the die is protected by an oxide layer with the exception of the places where the die is secured to the support and where aluminum is alloyed thereto.

In FIGS. 1, 2 and 3 the diffused zones are shown in an idealised form. In manufacturing the transistor it should be considered that during the diffusion the diffusing impurity will penetrate also from the edge of an opening below the oxide layer over a distance which is substantially equal to the thickness of the zone to be obtained. Moreover, a subsequent diffusion treatment will bring about a further diffusion of the impurity, which had already been diffused into the die. The lateral boundaries of the diffused zones will furthermore not be exactly rectangular as is shown.

In a practical embodiment the base zone was rectangular and had lateral dimensions of 120 x 50$\mu$, whereas the emitter zone had dimensions of 30 x 40$\mu$ and the minimal transverse dimensions at the centre of the part 1 was 40$\mu$.

Figure 4:
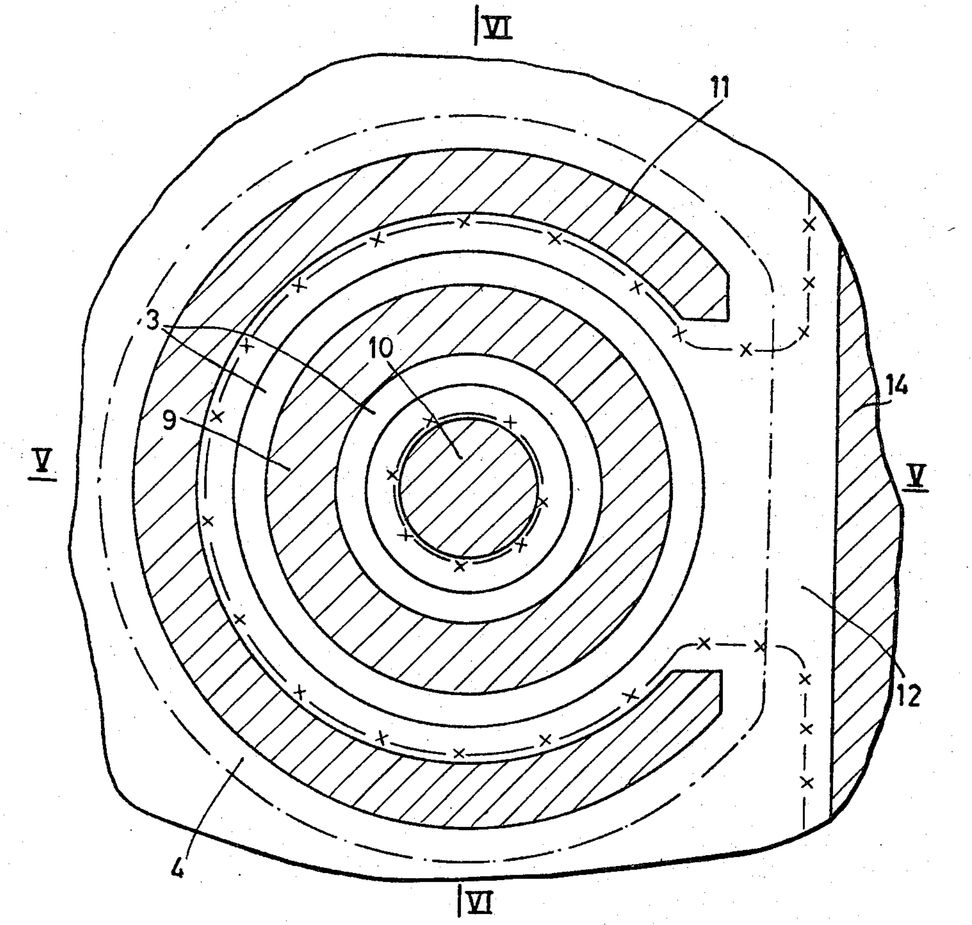
FIG. 4 is a plan view of a second embodiment of a transistor according to the invention.
Figure 5:
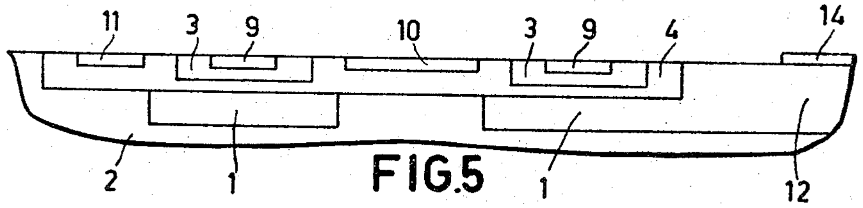
FIGS. 5 and 6 are cross sectional views taken on the lines V—V and VI—VI respectively in FIG. 4.
Figure 6:
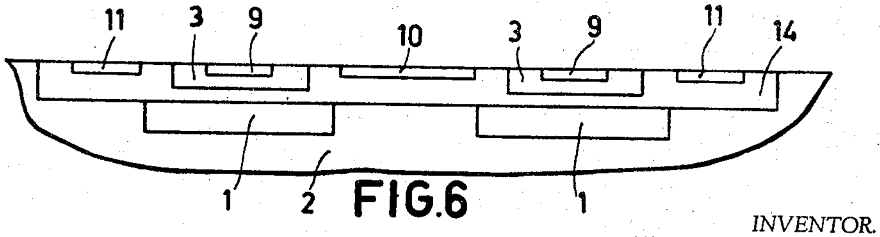

FIGS. 4, 5 and 6 show a second embodiment of a transistor according to the invention in which a concentric configuration is used. In these figures the same reference numerals are used as in FIGS. 1, 2 and 3. The outermost, surrounding base contact 11 has a gap. The extent of the base zone 4 is bounded in FIG. 4 by the dot-and-dash line. The more highly doped part 1 is located, in FIG. 4, between the two chain-cross lines and extends beyond the lateral boundaries of the base zone 4 (to the left) in a direction corresponding to the gap in the base contact 11. This concentric transistor may be obtained by a method of the kind described above of the transistor shown in FIGS. 1, 2 and 3, the openings in the various oxide layers having, however, a different shape.

The above-mentioned method comprises diffusion steps and alloying steps, but one or more of the zones may also be obtained by epitaxial growth.

Each of the devices described above may be employed in a conventional transistor arrangement in which the two base contacts are connected with each other. As is conventional, in operation, suitable biasing means are supplied, in cooperation with the signal, such that the emitter-base junction becomes biased in the forward direction to inject carriers into the base zone, which carriers can be collected at the reverse-biased collector junction.

What is claimed is:

1. A transistor comprising a semiconductor body having emitter, base, and collector zones of alternate conductivity type forming at least two p-n junctions, said emitter, base, and collector zones being arranged in series with the base zone contiguous with the emitter zone on one side and the collector zone on the other side, the thickness of the base zone being defined as its smallest dimension between the junctions, said emitter zone being smaller than both the base and collector zones in the direction parallel to the junctions, said collector zone having two regions of different impurity concentration and different conductivity each contiguous with the base zone, the region of the collector zone having the higher conductivity being located at least in part directly opposite the emitter zone, when viewed from the latter in the direction of thickness of the base zone, means for applying a potential to the emitter zone to cause the emitter-base junction to become forward biased to inject carriers into the base region, and means for biasing the collector zone in the reverse direction to collect the injected carriers.

2. A transistor as claimed in claim 1, wherein the said higher conductivity region viewed from the emitter zone in the direction of thickness of the base zone, is located directly opposite the whole of the emitter zone.

3. A transistor as claimed in claim 1, wherein the extent of the base zone, parallel to the junctions, is at least twice that of the emitter zone.

4. A transistor as claimed in claim 1, wherein the extent of the higher conductivity region, parallel to the junction, is not more than twice that of the emitter zone.

5. A transistor as claimed in claim 1, wherein the higher conductivity region of the collector zone extends beyond the lateral boundaries of the base zone in one or more lateral directions.

6. A transistor as claimed in claim 5, wherein the semiconductor body has a substantially flat surface on which the emitter zone is provided, and the part of the higher conductivity region which extends beyond the lateral boundaries of the base zone extends to said surface and is covered at least partly with a metal layer.

7. A transistor as claimed in claim 1, wherein the emitter zone has the form of a strip, which extends in its longitudinal direction substantially across the whole base zone.

8. A transistor as claimed in claim 7, wherein the higher conductivity region of the collector zone extends beyond the lateral boundaries of the base zone in the longitudinal direction of the emitter strip.

9. A transistor as claimed in claim 7, wherein two base contacts are provided each on one side of the emitter zone.

10. A transistor as claimed in claim 1, wherein the emitter zone is surrounded almost completely by a base contact.

11. A transistor as claimed in claim 10, wherein the higher conductivity region of the collector zone extends beyond the lateral boundaries of the base zone in a direction which corresponds to a gap in the surrounding base contact.

References Cited

UNITED STATES PATENTS

| | | | |
|---|---|---|---|
| 3,152,928 | 10/1964 | Hubner | 148—33.5 |
| 3,211,972 | 10/1965 | Kilby et al. | 317—235 |
| 3,244,950 | 4/1966 | Ferguson | 317—235 |
| 3,253,197 | 5/1966 | Haas | 317—235 |
| 3,260,902 | 7/1966 | Porter | 317—235 |

JOHN W. HUCKERT, *Primary Examiner.*

R. SANDLER, *Assistant Examiner.*